United States Patent
Kawaguchi et al.

(10) Patent No.: US 9,401,444 B2
(45) Date of Patent: Jul. 26, 2016

(54) SOLAR CELL AND MANUFACTURING METHOD THEREOF

(71) Applicant: FUJITSU LIMITED, Kawasaki-shi, Kanagawa (JP)

(72) Inventors: Kenichi Kawaguchi, Ebina (JP); Yoshiaki Nakata, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/643,304

(22) Filed: Mar. 10, 2015

(65) Prior Publication Data
US 2015/0187973 A1    Jul. 2, 2015

Related U.S. Application Data

(63) Continuation of application No. PCT/JP2012/073803, filed on Sep. 18, 2012.

(51) Int. Cl.
*H01L 31/0352* (2006.01)
*H01L 31/18* (2006.01)
(Continued)

(52) U.S. Cl.
CPC ......... *H01L 31/035236* (2013.01); *B82Y 20/00* (2013.01); *H01L 31/03046* (2013.01); *H01L 31/03529* (2013.01);
(Continued)

(58) Field of Classification Search
CPC .............. H01L 31/03046; H01L 31/035236; H01L 31/035281; H01L 31/03529; H01L 31/0735; H01L 31/184; H01L 31/1844; H01L 31/03048; H01L 31/035218; B82Y 20/00
See application file for complete search history.

(56) References Cited

U.S. PATENT DOCUMENTS

| | | | |
|---|---|---|---|
| 2011/0126891 A1* | 6/2011 | Goto | B82Y 20/00 136/255 |
| 2011/0146774 A1 | 6/2011 | Kim | |
| 2011/0146775 A1 | 6/2011 | Kim | |

FOREIGN PATENT DOCUMENTS

| | | |
|---|---|---|
| JP | 2004-63957 A1 | 2/2004 |
| JP | 2005-194609 A1 | 7/2005 |

(Continued)

OTHER PUBLICATIONS

Kawaguchi, et al "InAs quantum dots and quantum wells grown on stacking-fault controlled InP nanowires with wurtzite crystal structure" Applied Physics Letters, 99, pp. 1-3, published online Sep. 30, 2011.*

(Continued)

*Primary Examiner* — Marla D McConnell
(74) *Attorney, Agent, or Firm* — Kratz, Quintos & Hanson, LLP

(57) ABSTRACT

A solar cell includes a semiconductor substrate of a first conductivity; a pillar-shaped structure constituted by a semiconductor of the first conductivity, the pillar-shaped structure being formed on the semiconductor substrate; a superlattice layer including a barrier layer and a quantum structure layer that are alternately deposited on a side wall of the pillar-shaped structure, the quantum structure layer being constituted by a material having a smaller energy bandgap than that of the barrier layer, the quantum structure layer including a wurtzite type crystal part and a zinc blend type crystal part that are alternately arranged along an axial direction of the pillar-shaped structure; and a semiconductor layer of a second conductivity that is formed so as to surround the superlattice layer, the second conductivity being an opposite conductivity to that of the first conductivity.

5 Claims, 12 Drawing Sheets

(51) Int. Cl.
 *B82Y 20/00* (2011.01)
 *H01L 31/0304* (2006.01)
 *H01L 31/0735* (2012.01)

(52) U.S. Cl.
 CPC ... *H01L 31/035281* (2013.01); *H01L 31/0735* (2013.01); *H01L 31/184* (2013.01); *H01L 31/1844* (2013.01); *Y02E 10/544* (2013.01); *Y02P 70/521* (2015.11)

(56) References Cited

FOREIGN PATENT DOCUMENTS

| | | |
|---|---|---|
| JP | 2011-135058 A1 | 7/2011 |
| JP | 2011-527096 A1 | 10/2011 |
| JP | 2011-530829 A1 | 12/2011 |
| JP | 2012-501536 A1 | 1/2012 |
| JP | 2012-94588 A1 | 5/2012 |
| WO | WO 2010/010972 A1 | 1/2010 |

OTHER PUBLICATIONS van Weert, et al "Zinc Incorporation via the Vapor-Liquid-Solid Mechanism into InP Nanowires" JACS, 2009, 131, 4578-4579.*

Marti, et al.; "Quasi-Drift Diffusion Model for the Quantum Dot Intermediate Band Solar Cell;" IEEE Transactions on Electron Devices; vol. 49; No. 9; Sep. 2002; pp. 1632-1639 (8 Sheets)/pp. 1-2 of specification.

International Search Report for International Application No. PCT/JP2012/073803 dated Oct. 23, 2012.

* cited by examiner

SOLAR CELL AND MANUFACTURING METHOD THEREOF

CROSS-REFERENCE TO RELATED APPLICATION

This application is a U.S. continuation application filed under 35 USC 111(a) claiming benefit under 35 USC 120 and 365(c) of PCT Application PCT/JP2012/073803 filed on Sep. 18, 2012, the entire contents of which are incorporated herein by reference.

FIELD

The embodiments discussed herein are related to a solar cell and a manufacturing method thereof.

BACKGROUND

In order to effectively utilize natural energy, there is demand for a highly efficient solar cell. As a solar cell for realizing high efficiency, there is proposed an intermediate band solar cell in which quantum dots are stacked in a superlattice-like structure. This solar cell is formed by inserting, in a bulk light-absorbing layer of a semiconductor solar cell, a material having a longer absorption wavelength than that of the absorbing layer of the semiconductor solar cell, i.e., a material having low bandgap energy, as a quantum dot superlattice. By forming such a light-absorbing layer, it is possible to increase the light absorption amount while maintaining the open end voltage of the solar cell at a voltage that is determined by the bulk light-absorbing layer, thereby attaining high efficiency.

Non-patent Document 1: A. Marti et al., "Quasi-Drift Diffusion Model for the Quantum Dot Intermediate band solar cell", IEEE Transactions on Electron Devices, Vol. 49, No. 9, September 2002, pp. 1632-1639

In order to realize a quantum dot intermediate-band solar cell, the quantum dot layered structure needs to function as a structure in which quantum dots constitute a superlattice in a p-i-n stack direction and an intermediate-band is formed.

However, the semiconductor quantum dot layered structures that have been used up to now, have self-forming type S-K quantum dots based on distortion system materials such as an InAs quantum dot/(In)GaAs barrier layer and an InAs quantum dot/In(Ga) (As)P barrier layer. Therefore, it has not been possible to make the barriers thin, and there has been a limit in forming a closely stacked structure needed for functioning as a superlattice. Furthermore, the arrangement of quantum dots is based on the propagation of distortion, and therefore the distortion propagation has been uneven due to inconsistencies in the sizes of the quantum dots, thereby causing a problem in controlling the arrangements of quantum dots.

SUMMARY

According to an aspect of the embodiments, a solar cell includes a semiconductor substrate of a first conductivity; a pillar-shaped structure constituted by a semiconductor of the first conductivity, the pillar-shaped structure being formed on the semiconductor substrate; a superlattice layer including a barrier layer and a quantum structure layer that are alternately deposited on a side wall of the pillar-shaped structure, the quantum structure layer being constituted by a material having a smaller energy bandgap than that of the barrier layer, the quantum structure layer including a wurtzite type crystal part and a zinc blende type crystal part that are alternately arranged along an axial direction of the pillar-shaped structure; and a semiconductor layer of a second conductivity that is formed so as to surround the superlattice layer, the second conductivity being an opposite conductivity to that of the first conductivity.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

[First Embodiment]

A description is given of a solar cell and a manufacturing method thereof according to a first embodiment, with reference to FIGS. 1 through 7B.

Figure 1:
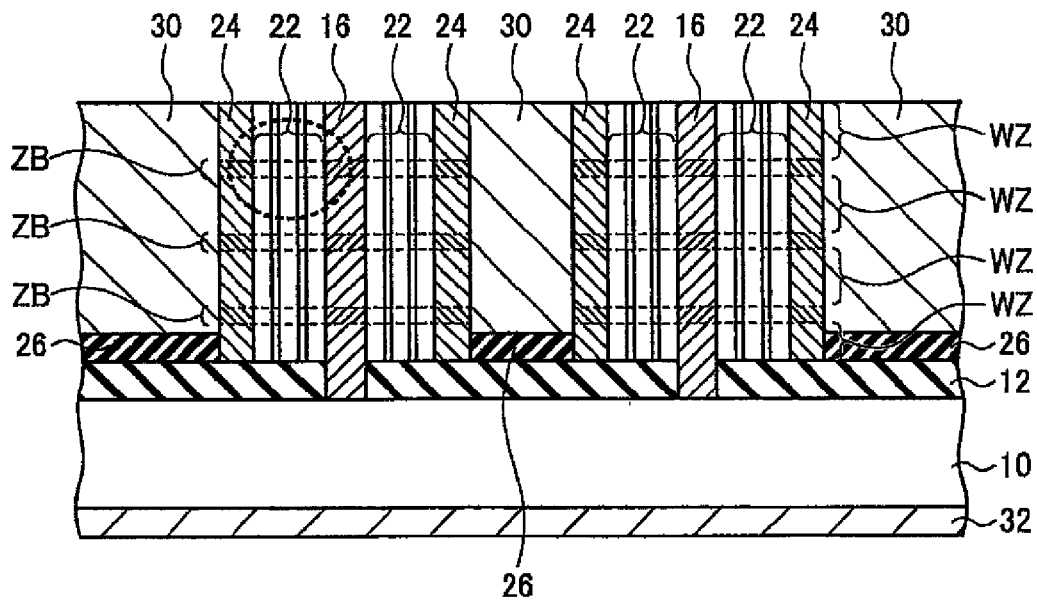
FIG. 1 is a schematic cross-sectional diagram of a structure of a solar cell according to a first embodiment (part 1)
Figure 2:
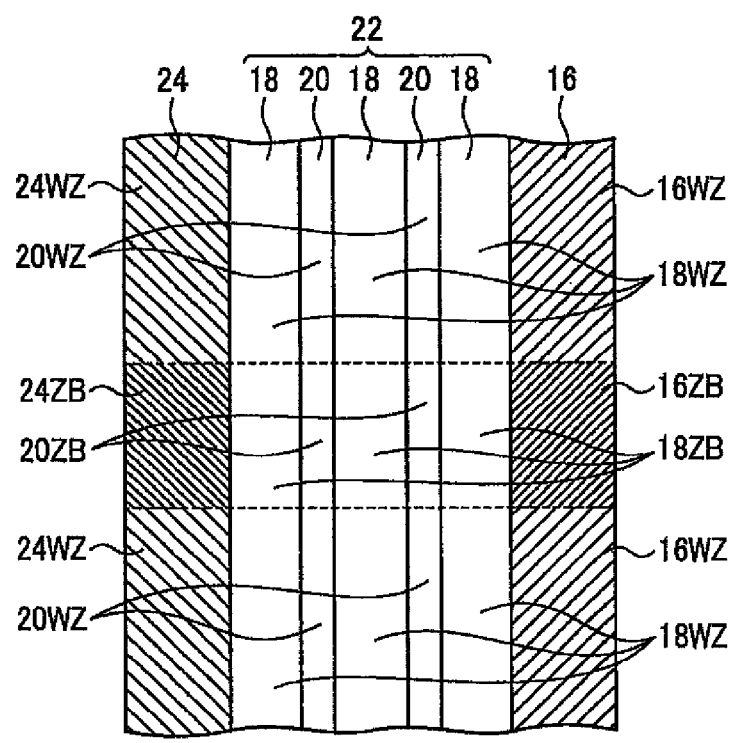
FIG. 2 is a schematic cross-sectional diagram of a structure of a solar cell according to the first embodiment (part 2)
Figure 3:
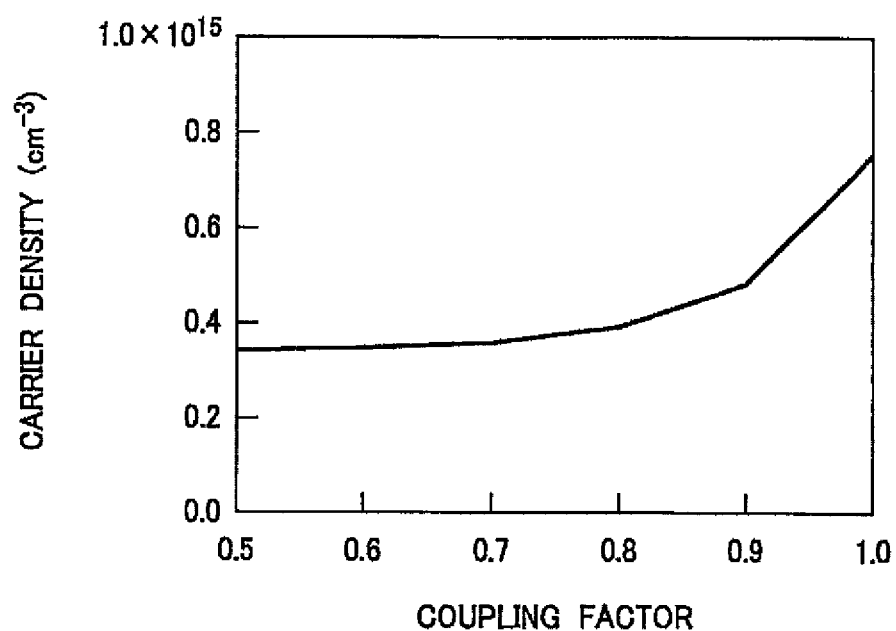
FIG. 3 is a graph indicating a relationship between a coupling factor of quantum dots and a generation carrier density in a quantum dot intermediate-band solar cell.

FIGS. 1 and 2 are schematic cross-sectional diagrams of a structure of a solar cell according to the present embodiment. FIG. 3 is a graph indicating the relationship between the coupling factor of quantum dots and the generation carrier density in a quantum dot intermediate-band solar cell. FIGS. 4A through 7B are process cross-sectional diagrams indicating the manufacturing method of the solar cell according to the present embodiment.

First, a description is given of the structure of the solar cell according to the present embodiment, with reference to FIGS. 1 and 2. FIG. 2 is an enlarged diagram of the part surrounded by a dotted line in FIG. 1.

On a semiconductor substrate 10 of a first conductivity type, pillar-shaped structures 16 are formed, which are constituted by a semiconductor of the first conductivity type (p type or n type). As illustrated in FIG. 2, the pillar-shaped structure 16 includes wurtzite type (hereinafter, also expressed as "WZ") crystal parts 16WZ, and zinc blende type (hereinafter, also expressed as "ZB") crystal parts 16ZB, which are alternately deposited in the axial direction (vertical direction in the diagram). Note that in the example of FIG. 1, on the WZ crystal part 16WZ, the ZB crystal part 16ZB and the WZ crystal part 16WZ are repeatedly deposited three times; however, the number of times of depositing the ZB crystal part 16ZB and the WZ crystal part 16WZ is not so limited.

On the semiconductor substrate 10, an insulating film 12 is formed in areas other than the areas where the pillar-shaped structures 16 are formed. On the side wall of the pillar-shaped structure 16 protruding on the insulating film 12, a superlattice layer 22 is formed. The superlattice layer 22 is formed by repeatedly depositing a barrier layer 18 and a quantum structure layer 20, so as to surround the pillar-shaped structure 16. In the present application specification, a quantum structure layer 20 means a layer formed by a material having a lower energy bandgap than that of the barrier layer, and a layer in which the same quantum confining structure as that of a quantum well and a quantum dot, etc., is formed. Note that the example of FIG. 1 indicates a superlattice layer 22 in which three barrier layers 18 and two quantum structure layers 20 are alternately deposited; however, the numbers of the deposited barrier layers 18 and quantum structure layers 20 are not so limited.

In the crystal structure of the barrier layer 18 and the quantum structure layer 20, the crystal structure of the pillar-shaped structure 16 that is the base is applied. That is to say, as illustrated in FIG. 2, the barrier layers 18 and the quantum structure layers 20 that are formed on the side walls of the WZ crystal parts 16WZ of the pillar-shaped structure 16, are formed by WZ crystals (WZ crystal part 18WZ, WZ crystal part 20WZ). Furthermore, the barrier layers 18 and the quantum structure layers 20 that are formed on the side walls of the ZB crystal parts 16ZB of the pillar-shaped structure 16, are formed by ZB crystals (ZB crystal part 18ZB, ZB crystal part 20ZB).

On the side wall of the superlattice layer 22, a semiconductor layer 24 of a second conductivity (n type or p type) is formed, so as to surround the superlattice layer 22.

Similar to the superlattice layer 22, in the crystal structure of the semiconductor layer 24, the crystal structure of the pillar-shaped structure 16 is applied. That is to say, as illustrated in FIG. 2, the semiconductor layer 24 formed on the side wall of the WZ crystal part 16WZ of the pillar-shaped structure 16 is formed by a WZ crystal (WZ crystal part 24WZ). Furthermore, the semiconductor layer 24 formed on the side wall of the ZB crystal part 16ZB of the pillar-shaped structure 16 is formed by a ZB crystal (ZB crystal part 24ZB).

On the side wall of the semiconductor layer 24, a second conductivity electrode 30 is formed, so as to surround the semiconductor layer 24. On the back side of the semiconductor substrate 10, a first conductivity electrode 32 is formed.

Note that FIG. 1 illustrates a state where two unit structures of the solar cell are formed on the semiconductor substrate 10. As for the unit structures of the solar cell, a desired number of unit structures may be arranged, in a linear manner or in a planar manner, according to need.

As described above, the solar cell according to the present embodiment is a solar cell having a p-i-n junction structure, in which a superlattice layer 22 is arranged in between the pillar-shaped structure 16 of a first conductivity and the semiconductor layer 24 of a second conductivity. The pillar-shaped structure 16, the superlattice layer 22, and the semiconductor layer 24 are formed by repeatedly depositing a WZ crystal and a ZB crystal along the axial direction of the pillar-shaped structure 16.

The incident light enters the solar cell from above the semiconductor substrate 10 (top side in FIG. 1). Furthermore, the direction of applying an electric field which is applied to the p-i-n junction via the first conductivity electrode 32 and the second conductivity electrode 30, i.e., the movement direction of the carriers, is the diameter direction of the cylinder forming the p-i-n junction. That is to say, the incidence direction of the light that is the detection target, and the direction of applying an electric field on the p-i-n junction, are directions that intersect each other.

The semiconductor device according to the present embodiment is formed by a group III-V compound semiconductor. The group III-V compound semiconductor has a unique bandgap energy according to the material, and the bandgap energy also depends on the crystal structure. For example, comparing a WZ crystal and a ZB crystal of the same material, the WZ crystal has a higher bandgap energy than the ZB crystal.

For example, focusing on the quantum structure layer 20 of FIG. 2, the bandgap energy of the WZ crystal part 20WZ of the quantum structure layer 20 is higher than the bandgap energy of the ZB crystal part 20ZB of the quantum structure layer 20. Therefore, the WZ crystal part 20WZ of the quantum structure layer 20 functions as a barrier layer with respect to the ZB crystal part 20ZB of the quantum structure layer 20. Then, by sandwiching this quantum structure layer 20 with barrier layers 18 of a material having a wider energy bandgap than the material of the quantum structure layer 20, a ring-shaped quantum box surrounding the pillar-shaped structure 16 is formed at the part of the ZB crystal part 20ZB of the quantum structure layer 20. Thus, it becomes possible to confine the carriers in the ZB crystal part 20ZB of the quantum structure layer 20.

Furthermore, by forming the quantum structure layer 20 by repeatedly depositing the barrier layer 18 and the quantum structure layer 20 on the side wall of the pillar-shaped structure 16, a plurality of ring-shaped quantum boxes are formed in a in a concentric fashion so as to surround the pillar-shaped structure 16. Then, in the diameter direction of these concentric circles (horizontal direction in the diagram), a quantum structure is formed, in which electron states are coupled like a superlattice, and it is possible to realize the same function as that of a quantum dot intermediate-band solar cell.

Particularly, the ZB crystal parts 18ZB, 20ZB of the barrier layer 18 and the quantum structure layer 20 are selectively formed on the ZB crystal part 16ZB of the pillar-shaped structure 16, and therefore it is possible to easily align the plurality of ring-shaped quantum boxes along the diameter direction of the concentric circles. Accordingly, the ratio of the electronic coupling of quantum boxes arranged along the diameter direction of the concentric circles, is significantly increased.

Furthermore, this kind of superlattice structure is not formed with a distortion system material, and therefore it is possible to make the barrier layer 18 thin, and the number of deposited barrier layers 18 and quantum structure layers 20 may be increased. Accordingly, the efficiency of the solar cell may be further increased.

The material system for realizing the solar cell according to the present embodiment is not particularly limited; for example, a material of using the superlattice structure of a InP/InGaAs system, or a material using a superlattice system of a GaAs/InGaAs system, may be applied.

In an example using a superlattice structure of the InP/InGaAs system, the semiconductor substrate 10, the pillar-shaped structure 16, the barrier layer 18, and the semiconductor layer 24 may be formed by InP, and the quantum structure layer 20 may be formed by InGaAs. Furthermore, in an example using a superlattice structure of the GaAs/InGaAs system, the semiconductor substrate 10, the pillar-shaped structure 16, the barrier layer 18, and the semiconductor layer 24 may be formed by GaAs, and the quantum structure layer 20 may be formed by InGaAs.

FIG. 3 is a graph expressing changes in the generation carrier density with respect to a coupling factor, in a quantum dot intermediate-band solar cell having ten stacked layers of quantum dots.

This graph has been calculated by using the following formula (1), based on detailed studies by inventors of the present invention based on a diffusion equation described in Non-patent Document 1. Here, $D_e$ is the diffusion coefficient of electrons, $B_e$ is the radiation recombination coefficient, $N_{Dh}$ is the state density of holes, $g_{eh}$ is the carrier generation speed in the bulk absorption layer (i.e., the barrier layer of quantum dots), and $g_e$ is the carrier generation speed by the intermediate band of the term unique to the intermediate-band solar cell.

$$D_e \cdot d^2 \Delta n/dx^2 - B_e N_{Dh} \Delta n = -g_e(x) - g_{eh} \quad (1)$$

Here, $g_e$ may be described as in the following formula (2), as a term dependent on an effective band factor $\epsilon$. Here, X is the light condensation coefficient, and 1000Sun which is a typical light condensation solar cell is used.

$$g_e(x) = \epsilon \int \alpha_e X \sin^2 \theta \cdot 2\pi/h^3 c^2 \cdot E^2/(\exp(E/K_B T) - 1) \cdot dE \quad (2)$$

The effective band factor $\epsilon$ is obtained as follows, where n is the number of quantum dots and $\delta$ is the coupling factor of the quantum dots.

$$\epsilon = n\delta^n$$

Based on the calculation results of FIG. 3, compared to the case where the quantum dots are coupled only by a probability of 50%, it is possible to couple the quantum dots by 100%, and the number of generated carriers is increased by approximately two times. This result indicates that the number of generated carriers may also be significantly increased in a solar cell according to the present embodiment in which the coupling ratio of quantum boxes may be significantly increased.

Next, a description is given of the manufacturing method of the solar cell according to the present embodiment, with reference to FIGS. 4A through 7B.

First, the insulating film 12 is formed on the semiconductor substrate 10 of the first conductivity by, for example, a CVD method. As the semiconductor substrate 10 of the first conductivity, for example, an n-InP substrate having an impurity density of $5 \times 10^{17}$ cm$^{-3}$ through $1 \times 10^{19}$ cm$^{-3}$ may be applied. Furthermore, as the insulating film 12, a silicon oxide film may be applied.

Figure 4A:
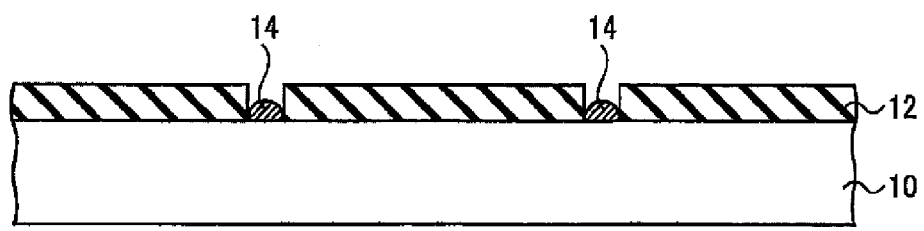
FIGS. 4A and 4B are process cross-sectional diagrams indicating a manufacturing method of a solar cell according to the first embodiment (part 1)

Next, parts of the insulating film 12, in the areas where the pillar-shaped structures 16 are to be formed, are removed. On the parts of the semiconductor substrate 10 that have become exposed by removing the insulating film 12, metal particles 14 such as Au are deposited (FIG. 4A).

For example, on the insulating film 12, a photoresist film (not illustrated) is formed for exposing the areas where the pillar-shaped structures 16 are to be formed, the insulating film 12 is etched by using this photoresist film as a mask, and parts of the insulating film 12 in the areas where the pillar-shaped structures 16 are to be formed, are removed. By removing the photoresist film after depositing the metal particles 14, the metal particles 14 selectively remain in the areas where the pillar-shaped structures 16 are to be formed.

Figure 4B:
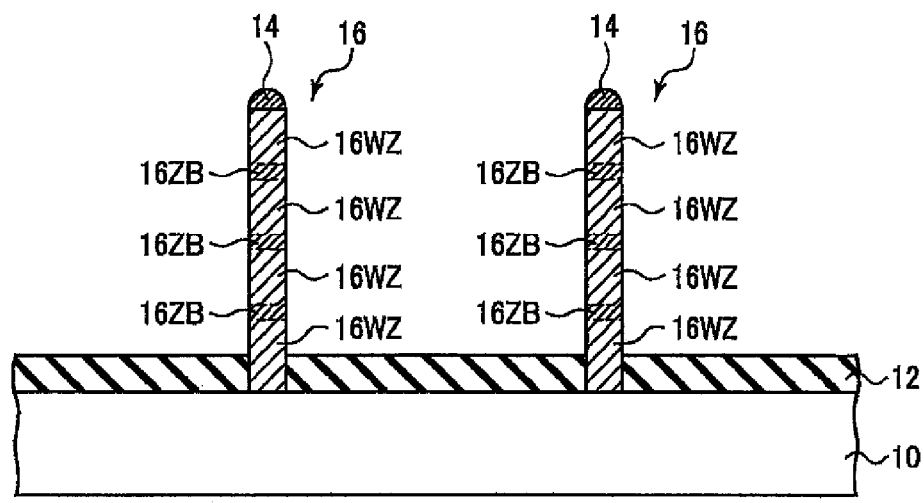

Next, for example, by a MOVPE method, by using the metal particles 14 as a catalyst, on the semiconductor substrate 10 in the areas that are not covered by the insulating film 12, the pillar-shaped structures 16 are formed. The pillar-shaped structure 16 is constituted by a semiconductor of a first conductivity, in which the WZ crystal part 16WZ and the ZB crystal part 16ZB are alternately deposited (FIG. 4B).

The pillar-shaped structure 16 of the first conductivity may be formed by, for example, n-InP having a diameter of 150 nm, a length of 4 μm, and an impurity density of $5 \times 10^{17}$ cm$^{-3}$ through $1 \times 10^{19}$ cm$^{-3}$. The structure in which the WZ crystal part 16WZ and the ZB crystal part 16ZB are repeatedly deposited, may be formed by alternately switching the doping material.

For example, when InP is grown by the MOVPE method by using trimethylindium (TMIn) and phosphine (PH$_3$) as the raw materials, hydrogen sulfide (H$_2$S) and disilane (Si$_2$H$_6$), which are raw materials of an n type dopant, are alternately supplied. When hydrogen sulfide (H$_2$S) is used, which is the raw material of an n type dopant, the n-InP of a WZ crystal is grown. When disilane (Si$_2$H$_6$) is used, which is the raw material of an n type dopant, the n-InP of a ZB crystal is grown. The growth temperature is, for example, 380° C. through 400° C., and the V/III ratio (flow rate ratio of PH$_3$ and TMI) is, for example, approximately 100 through 500.

Then length of the WZ crystal part 16WZ and the ZB crystal part 16ZB in the axial direction of the pillar-shaped structure 16 (vertical direction in the diagram) may be controlled according to the growth time. The axial direction size of the ZB crystal part 16ZB is preferably approximately less than or equal to 20 nm. By setting the axial direction size of the ZB crystal part 16ZB to be approximately less than or equal to 20 nm, it is possible to introduce a quantum effect in the axial direction, and form a structure having small property changes with respect to the environmental temperature.

Next, by a generally-known etching technique, the metal particles 14 remaining on the leading ends of the pillar-shaped structures 16 are removed.

Next, for example, by a MOVPE method, the superlattice layer 22 is formed as a light absorption layer, so as to surround the side walls of the pillar-shaped structure 16. The superlattice layer 22 is formed by repeatedly depositing the barrier layer 18 and the quantum structure layer 20 by, for example, 10 cycles through 30 cycles. Note that the diagrams illustrate the superlattice layer 22 including three barrier layers 18 and two quantum structure layers 20.

As the barrier layer 18, for example, InGaAs may be applied. As the raw materials of InGaAs, for example, trimethylindium (TMIn), trimethylgallium (TEGa), and arsine (AsH$_3$) may be used.

As the quantum structure layer 20, for example, InP may be applied. As the raw materials of InP, trimethylindium (TMIn) and phosphine (PH$_3$) may be used.

In this case, the growth temperature is 530° C. through 580° C., and as for InP, the V/III ratio (flow rate ratio of PH$_3$ and TMI) is 1000 through 3000, and as for InGaAs, the V/III ratio (flow rate ratio of AsH$_3$ and TMI+TEG) is 300 through 1000. Accordingly, it is possible to cause the barrier layers 18 and the quantum structure layers 20 to selectively grow on the side wall of the pillar-shaped structure 16.

The thickness of the barrier layer 18 and the quantum structure layer 20 is not particularly limited; for example, the thickness may be approximately 3 nm through 5 nm.

Figure 5A:
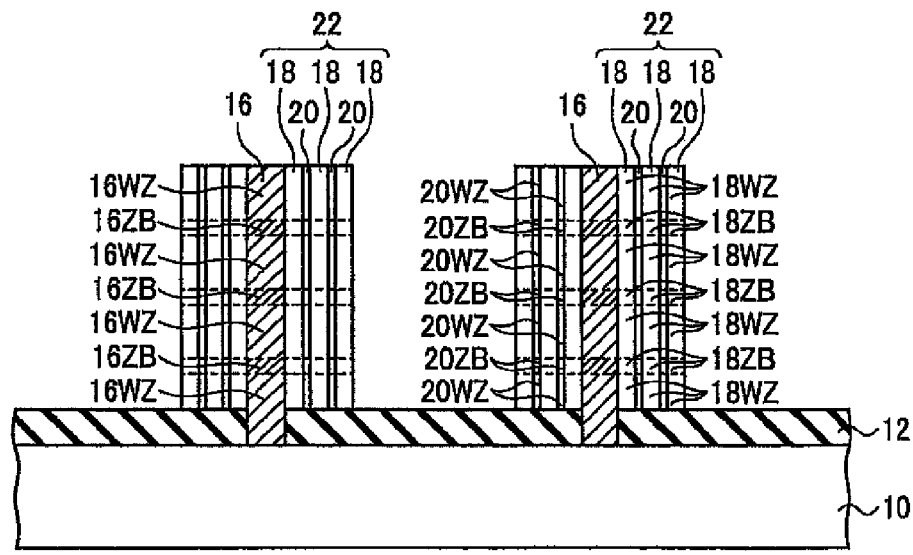
FIGS. 5A and 5B are process cross-sectional diagrams indicating a manufacturing method of a solar cell according to the first embodiment (part 2)

When the superlattice layer 22 is caused to grow on the side wall of the pillar-shaped structure 16 in which the WZ crystal part 16WZ and the ZB crystal part 16ZB are alternately deposited, the crystal structure of the pillar-shaped structure 16 is also applied in the barrier layer 18 and the quantum structure layer 20. That is to say, on the side wall of the WZ crystal part 16WZ of the pillar-shaped structure 16, a barrier layer of a WZ crystal (WZ crystal part 18WZ) and a quantum structure layer of a WZ crystal (WZ crystal part 20WZ) are formed. Furthermore, on the side wall of the ZB crystal part 16ZB of the pillar-shaped structure 16, a barrier layer of a ZB crystal (ZB crystal part 18ZB) and a quantum structure layer of a ZB crystal (ZB crystal part 20ZB) are formed (FIG. 5A).

Next, for example, by a MOVPE method, the semiconductor layer 24 of the second conductivity is formed on the side wall of the pillar-shaped structure 16 on which the superlattice layer 22 is formed. As the semiconductor layer 24 of the second conductivity, for example, a p-InP having an impurity density of $5 \times 10^{17}$ cm$^{-3}$ through $1 \times 10^{19}$ cm$^{-3}$ may be applied. As the raw material of the p type dopant, for example, diethyl zinc (DEZ) may be applied.

Figure 5B:
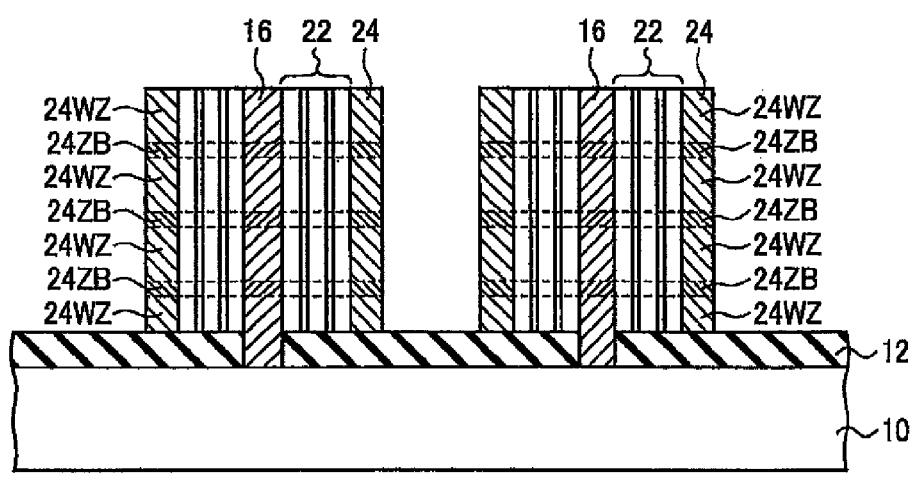

In this case, the crystal structure of the superlattice layer 22 is applied to the semiconductor layer 24, and a semiconductor layer of a WZ crystal (WZ crystal part 24WZ) is formed on the side wall of the WZ crystal part 18WZ of the barrier layer 18. Furthermore, on the side wall of the ZB crystal part 18ZB of the barrier layer 18, a semiconductor layer of a ZB crystal (ZB crystal part 24ZB) is formed (FIG. 5B).

Figure 6A:
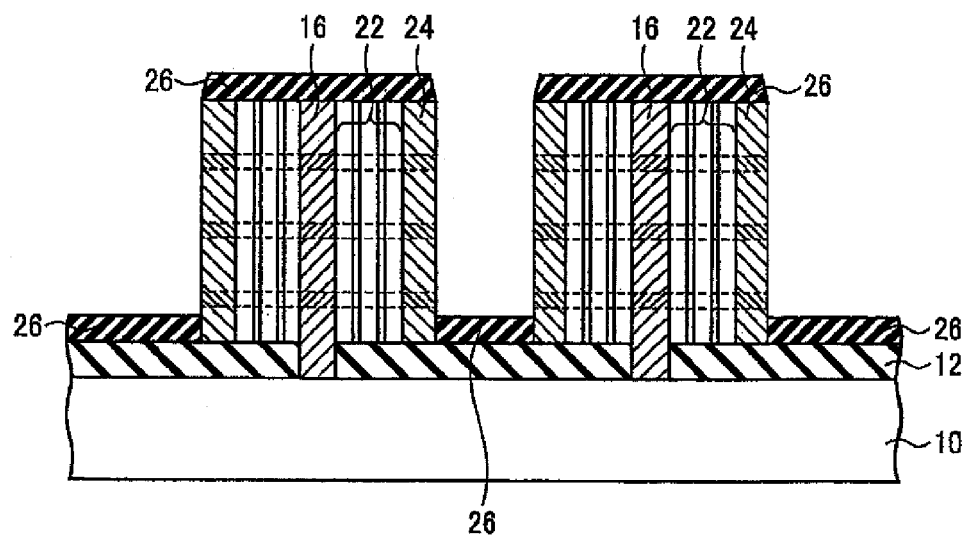
FIGS. 6A and 6B are process cross-sectional diagrams indicating a manufacturing method of a solar cell according to the first embodiment (part 3)

Next, on the entire surface, an insulating film 26 to act as a protection film is deposited by, for example, a CVD method (FIG. 6A). As the insulating film 26, for example, a silicon oxide film may be applied.

Figure 6B:
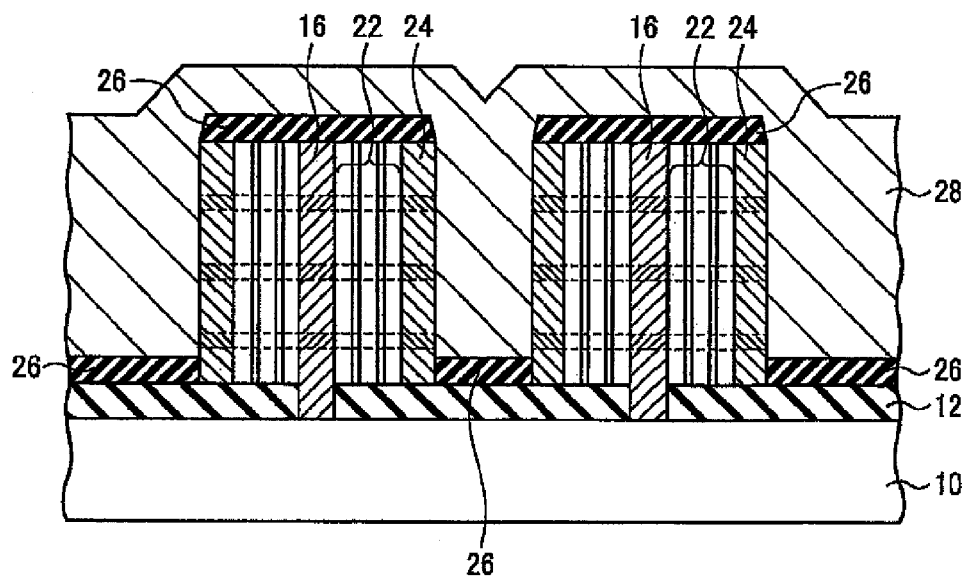

Next, on the entire surface, a transparent conductive film 28 to become the second conductivity electrode 30, is deposited by, for example, a sputtering method (FIG. 6B). As the transparent conductive film 28, for example, a CuAlO$_2$ film may be applied.

Figure 7A:
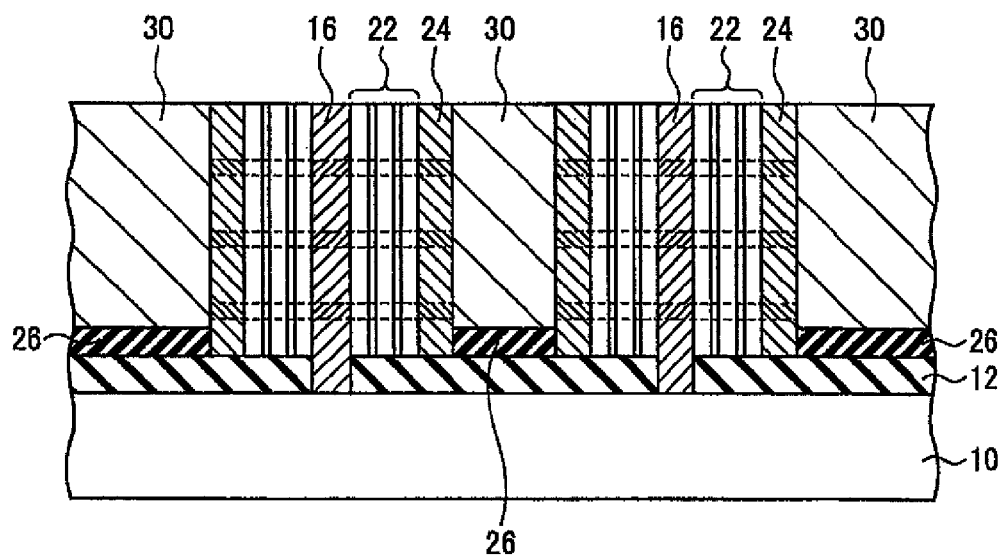
FIGS. 7A and 7B are process cross-sectional diagrams indicating a manufacturing method of a solar cell according to the first embodiment (part 4)

Next, for example, by a CMP method, the transparent conductive film 28 and the insulating film 26 are removed from the top ends of the pillar-shaped structure 16, the superlattice layer 22, and the semiconductor layer 24, and the second conductivity electrode 30 embedded between the semiconductor layers 24 is formed (FIG. 7A).

Note that when the insulating film 26 at the tops end of the pillar-shaped structure 16, the superlattice layer 22, and the semiconductor layer 24, functions as an anti-reflection film, the transparent conductive film 28 and the insulating film 26 at the top ends of the pillar-shaped structure 16, the superlattice layer 22, and the semiconductor layer 24 need not always be removed. Furthermore, on the second conductivity electrode 30, a grid type metal electrode may be formed.

Figure 7B:
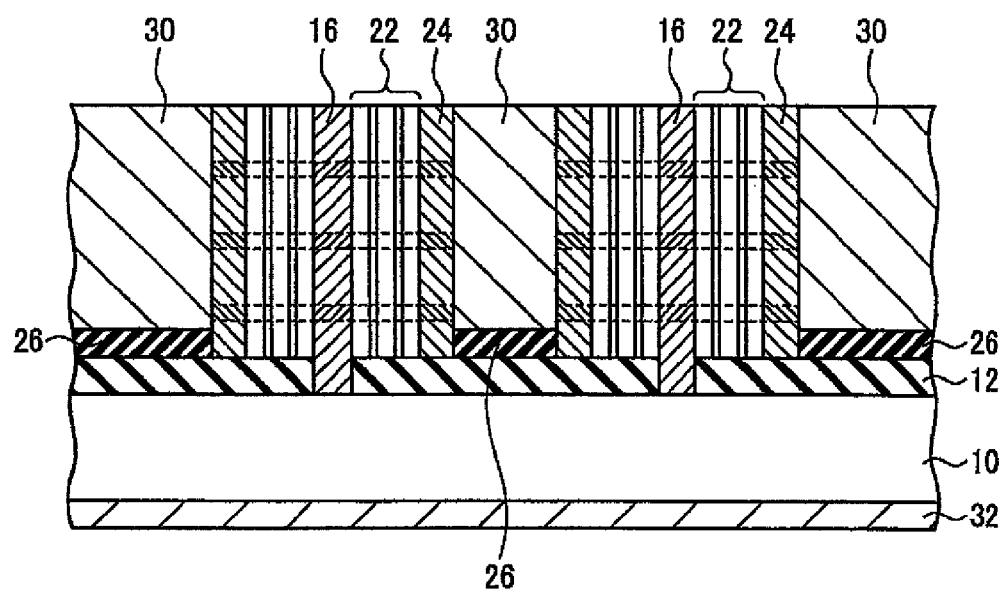

Next, on the back side of the semiconductor substrate 10, the first conductivity electrode 32 is formed, and the solar cell according to the present embodiment is completed (FIG. 7B).

As described above, according to the present embodiment, by using the difference in the energy bandgap between the wurtzite type crystal and the zinc blende type crystal, and a barrier layer, a three-dimensional quantum confining structure is formed, and therefore it is easy to closely stack and align the quantum confining structures. Accordingly, a highly-efficient solar cell may be realized.

[Second Embodiment]

A description is given of a solar cell and a manufacturing method thereof according to a second embodiment, with reference to FIGS. 8 through 10B. The same elements as those of the solar cell and the manufacturing method thereof according to the first embodiment illustrated in FIGS. 1 through 7B are denoted by the same reference numerals, and descriptions thereof are omitted or simplified.

Figure 8:
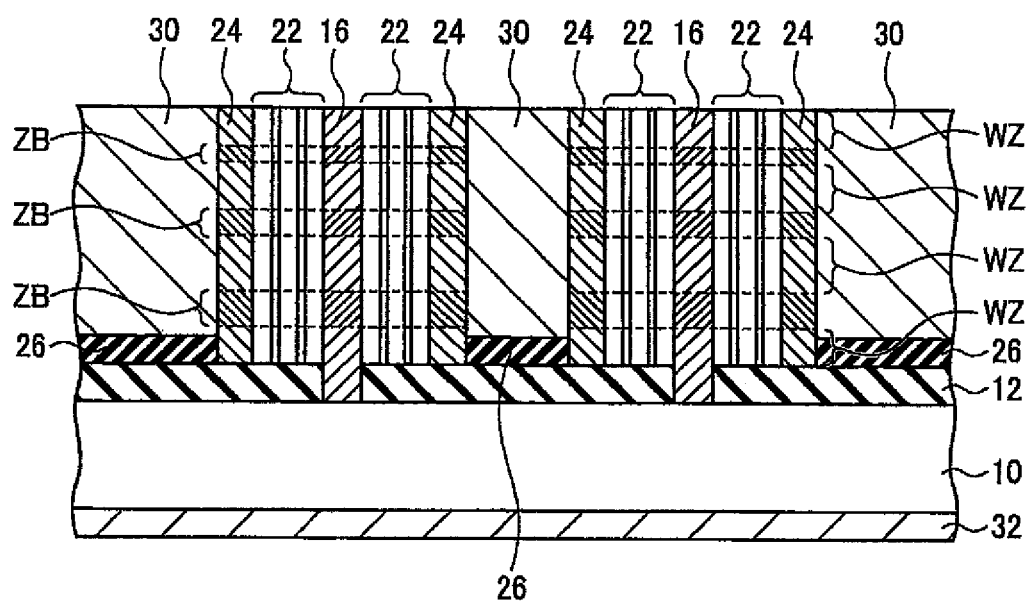
FIG. 8 is a schematic cross-sectional diagram of a structure of a solar cell according to a second embodiment.

FIG. 8 is a schematic cross-sectional diagram of a structure of the solar cell according to the present embodiment. FIGS. 9A through 10B are process cross-sectional diagrams indicating the manufacturing method of the solar cell according to the present embodiment.

As illustrated in FIG. 8, the solar cell according to the present embodiment is the same as the solar cell according to the first embodiment, except that the ZB crystal parts 16ZB, 18ZB, 20ZB, 24ZB have different sizes in the axial direction of the pillar-shaped structure 16.

That is to say, in the solar cell according to the present embodiment, the ZB crystal parts 20ZB of the quantum structure layer 20 have sizes in the axial direction of the pillar-shaped structure 16 that are not consistent as in the solar cell according to the first embodiment; the closer the ZB crystal part 20ZB is to the semiconductor substrate 10, the larger the size of the ZB crystal part 20ZB. In order to form such a structure, also with respect to the sizes in the axial direction of the pillar-shaped structure 16 of the ZB crystal parts 16ZB, 18ZB, 24ZB of the pillar-shaped structure 16, the barrier layer 18, and the semiconductor layer 24, the closer the ZB crystal part 16ZB, 18ZB, 24ZB is to the semiconductor substrate 10, the larger the size of the ZB crystal part 16ZB, 18ZB, 24ZB.

By forming the ZB crystal parts 20ZB such that the closer the ZB crystal part 20ZB is to the semiconductor substrate 10, the larger the size of the ZB crystal part 20ZB in the axial direction, it is possible to absorb, in a wide wavelength area, the light of wavelengths that are longer than the wavelength corresponding to the bandgap energy of the barrier layer 18. Furthermore, with respect to incident light entering from the front side, the respective ZB crystal parts 20ZB are able to absorb the light.

Note that if the ZB crystal parts 20ZB are formed such that the closer the ZB crystal part 20ZB is to the semiconductor substrate 10, the smaller the size of the ZB crystal part 20ZB in the axial direction, it becomes difficult for the ZB crystal parts 20ZB closer to the semiconductor substrate 10 to function. Therefore, it is preferable that the closer the ZB crystal part 20ZB is to the semiconductor substrate 10, the larger the size of the ZB crystal part 20ZB in the axial direction.

When the barrier layer energy barrier height is infinite, the quantum dot has energy shift ΔE expressed by the following formula (3) according to quantization. Here, $l_x$, $l_y$, $l_z$ respectively express the sizes of the quantum dot in the x, y, and z directions.

$$\Delta E = h^2/8\pi^2 m \cdot (\pi/l_x)^2 + (\pi/l_y)^2 + (\pi/l_z)^2 \qquad (3)$$

However, the actual quantum dot is surrounded by barrier layers having a limited bandgap, and therefore the maximum shift amount corresponds to the barrier material and the band offset amount of the barrier material.

In the solar cell according to the present embodiment, the energy shift amount that is changed by changing the height of the ZB crystal part 20ZB, i.e., the $l_z$, corresponds to the height of the barrier formed by the WZ crystal and the ZB crystal, i.e., approximately 100 meV, in the case where the absorption layer material is, for example, InGaAs. The energy difference becomes, for example, approximately a wavelength interval of approximately 106 nm near the wavelength of 1.2 μm, and approximately a wavelength interval of approximately 142 nm near the wavelength of 1.4 μm.

Next, a description is given of the manufacturing method of the solar cell according to the present embodiment, with reference to FIGS. 9A through 10B.

Figure 9A:
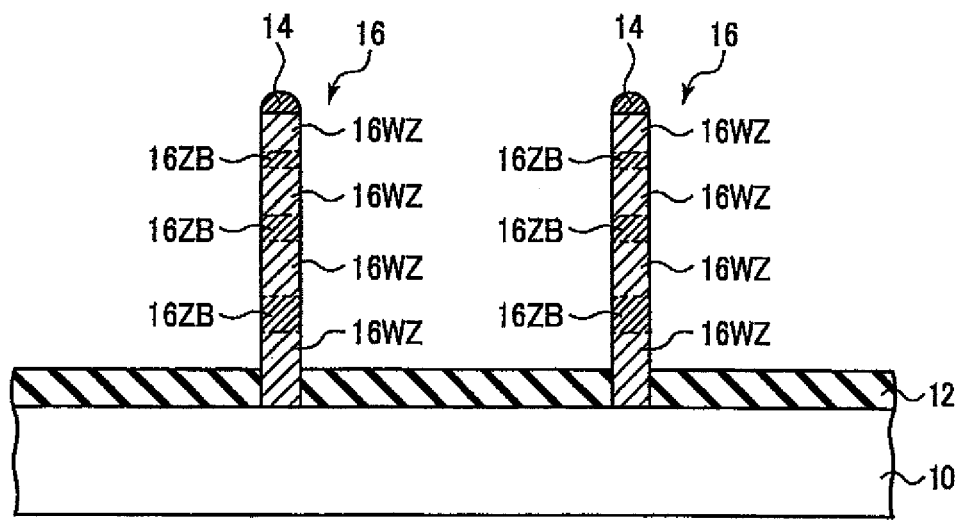
FIGS. 9A and 9B are process cross-sectional diagrams indicating a manufacturing method of a solar cell according to the second embodiment (part 1)

First, in the same manner as the manufacturing method of the solar cell according to the first embodiment illustrated in FIGS. 4A and 4B, on a semiconductor substrate 10, pillar-shaped structures 16 are formed, which are formed by repeatedly depositing the WZ crystal part 16WZ and the ZB crystal part 16ZB. At this time, the growth time when forming the ZB crystal parts 16ZB is appropriately controlled to form the ZB crystal parts 16ZB such that the closer the ZB crystal part 16ZB is to the semiconductor substrate 10, the larger the size of the ZB crystal part 16ZB in the axial direction (FIG. 9A).

Next, by a generally-known etching technique, the metal particles 14 remaining on the leading ends of the pillar-shaped structures 16 are removed.

Next, in the same manner as the manufacturing method of the solar cell according to the first embodiment illustrated in FIG. 5A, the superlattice layer 22 is formed so as to surround the side walls of the pillar-shaped structure 16. The superlattice layer 22 is formed by repeatedly depositing the barrier layer 18 and the quantum structure layer 20.

Figure 9B:
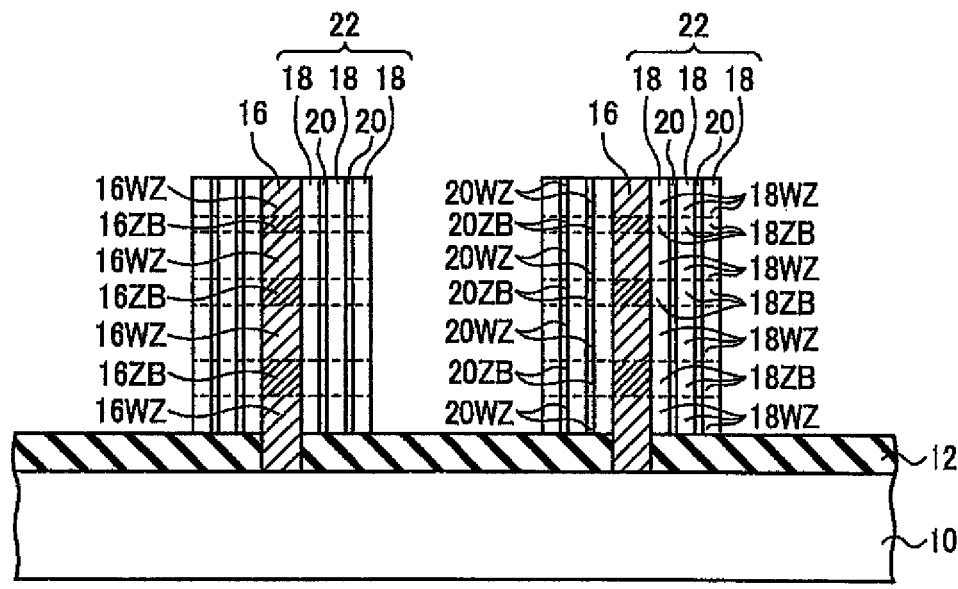

When the superlattice layer 22 is caused to grow on the side walls of the pillar-shaped structure 16 in which the WZ crystal part 16WZ and the ZB crystal part 16ZB are alternately deposited, the crystal structure of the pillar-shaped structure 16 is also applied to the barrier layer 18 and the quantum structure layer 20. That is to say, on the slide wall of the WZ crystal part 16WZ of the pillar-shaped structure 16, a barrier layer of a WZ crystal (WZ crystal part 18WZ) and a quantum structure layer of a WZ crystal (WZ crystal part 20WZ) are formed. Furthermore, on the side wall of the ZB crystal part 16ZB of the pillar-shaped structure 16, a barrier layer of a ZB crystal (ZB crystal part 18ZB) and a quantum structure layer of a ZB crystal (ZB crystal part 20ZB) are formed. With respect to the sizes of the ZB crystal parts 18ZB, 20ZB, the closer the ZB crystal part 18ZB, 20ZB is to the semiconductor substrate 10, the larger the size of the ZB crystal part 18ZB, 20ZB in the axial direction of the pillar-shaped structure 16 such that the sizes of the ZB crystal parts 16ZB in the axial direction are applied (FIG. 9B).

Next, in the same manner as the manufacturing method of the solar cell according to the first embodiment illustrated in FIG. 5B, the semiconductor layer 24 of the second conductivity is formed on the side wall of the pillar-shaped structure 16 on which the superlattice layer 22 is formed.

In this case, the crystal structure of the superlattice layer 22 is applied to the semiconductor layer 24, and a semiconductor layer of a WZ crystal (WZ crystal part 24WZ) is formed on the side wall of the WZ crystal part 18WZ of the barrier layer 18. Furthermore, on the side wall of the ZB crystal part 18ZB of the barrier layer 18, a semiconductor layer of a ZB crystal (ZB crystal part 24ZB) is formed. With respect to the sizes of the ZB crystal parts 24ZB, the closer the ZB crystal part 24ZB is to the semiconductor substrate 10, the larger the size of the ZB crystal part 24ZB in the axial direction of the pillar-shaped structure 16, such that the sizes of the ZB crystal parts 16ZB in the axial direction are applied (FIG. 10B).

Figure 10A:
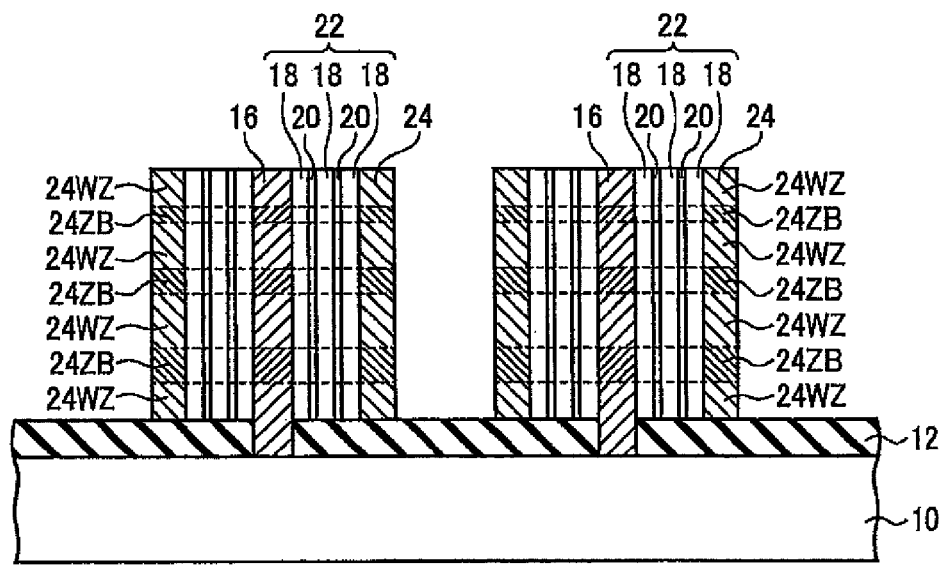
FIGS. 10A and 10B are process cross-sectional diagrams indicating a manufacturing method of a solar cell according to the second embodiment (part 2)
Figure 10B:
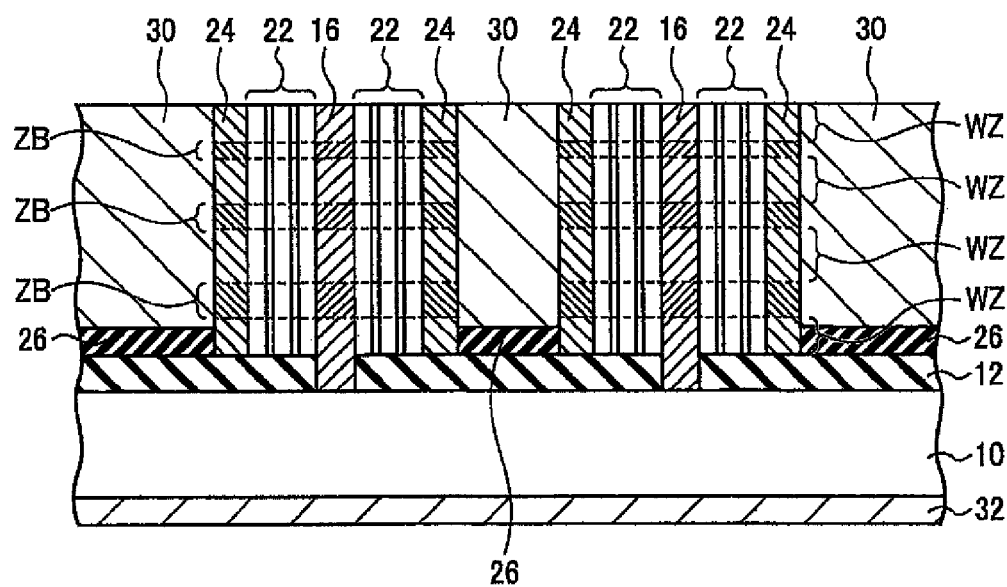

Next, in the same manner as the manufacturing method of the solar cell according to the first embodiment illustrated in FIGS. 6A through 7B, the insulating film 26, the second conductivity electrode 30, and the first conductivity electrode 32 are formed, thereby completing the solar cell according to the present embodiment (FIG. 10B).

As described above, according to the present embodiment, by using the difference in the energy bandgap between the wurtzite type crystal and the zinc blende type crystal, and a barrier layer, a three-dimensional quantum confining structure is formed, and therefore it is easy to closely stack and align the quantum confining structure. Accordingly, a highly-efficient solar cell may be realized. Furthermore, by forming quantum confining structures of different sizes, it is possible to absorb light in a wide wavelength area, thereby further increasing the efficiency.

[Third Embodiment]

A description is given of a solar cell and a manufacturing method thereof according to a third embodiment, with reference to FIGS. 11 through 13B. The same elements as those of the solar cell and the manufacturing method thereof according to the first and second embodiments illustrated in FIGS. 1 through 10B are denoted by the same reference numerals, and descriptions thereof are omitted or simplified.

Figure 11:
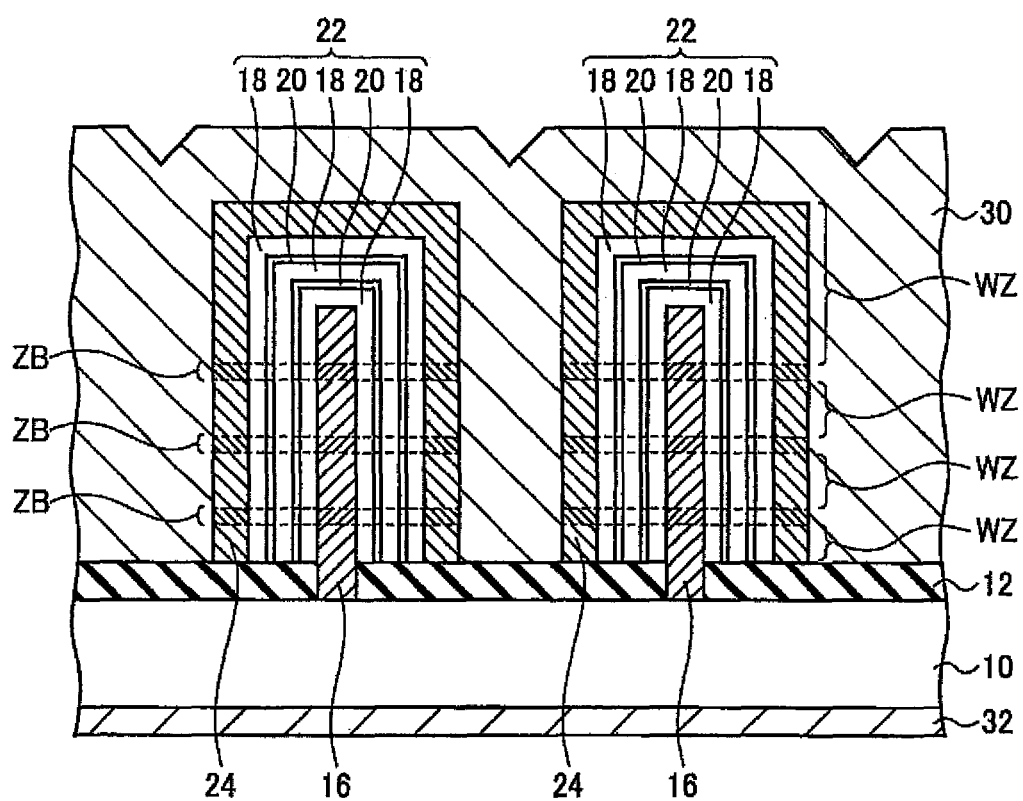
FIG. 11 is a schematic cross-sectional diagram of a structure of a solar cell according to a third embodiment.

FIG. 11 is a schematic cross-sectional diagram of a structure of the solar cell according to the present embodiment. FIGS. 12A through 13B are process cross-sectional diagrams indicating the manufacturing method of the solar cell according to the present embodiment.

As illustrated in FIG. 11, the solar cell according to the present embodiment is the same as the solar cell according to the first embodiment, except that the superlattice layer 22 and the semiconductor layer 24 are formed so as to cover the top part of the pillar-shaped structure 16. By forming such a structure, it is possible to simplify the manufacturing processes, because it is not needed to form the insulating film 26 or to remove the second conductivity electrode 30 at the top part of the pillar-shaped structure 16.

Next, a description is given of the manufacturing method of the solar cell according to the present embodiment, with reference to FIGS. 12A through 13B.

Figure 12A:
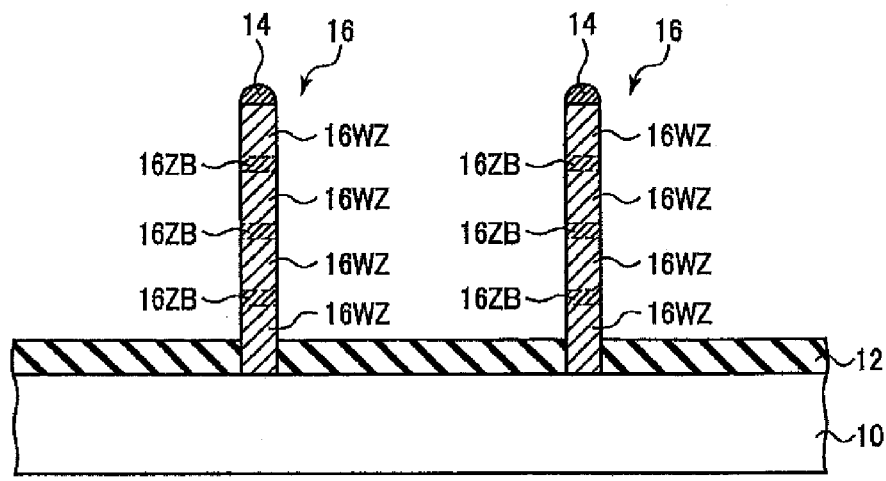
FIGS. 12A and 12B are process cross-sectional diagrams indicating a manufacturing method of a solar cell according to the third embodiment (part 1)

First, in the same manner as the manufacturing method of the solar cell according to the first embodiment illustrated in FIGS. 4A and 4B, on a semiconductor substrate 10, pillar-shaped structures 16 are formed, which are formed by repeatedly depositing the WZ crystal part 16WZ and the ZB crystal part 16ZB (FIG. 12A).

Next, by a generally-known etching technique, the metal particles 14 remaining on the leading ends of the pillar-shaped structures 16 are removed.

Next, in the same manner as the manufacturing method of the solar cell according to the first embodiment illustrated in FIG. 5A, the superlattice layer 22 is formed so as to surround the side walls of the pillar-shaped structure 16. The superlattice layer 22 is formed by repeatedly depositing the barrier layer 18 and the quantum structure layer 20.

Figure 12B:
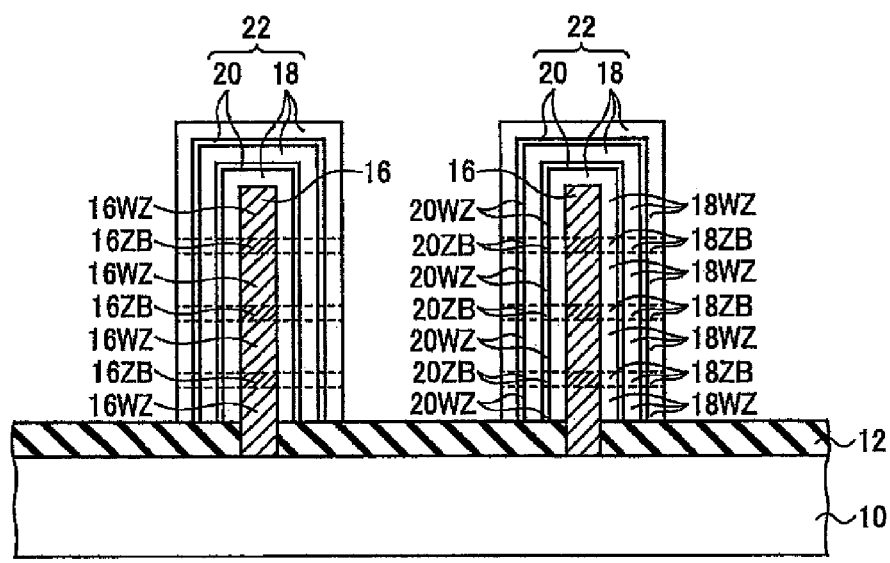

When the superlattice layer 22 is caused to grow on the side walls of the pillar-shaped structure 16 in which the WZ crystal part 16WZ and the ZB crystal part 16ZB are alternately deposited, the crystal structure of the pillar-shaped structure 16 is also applied to the barrier layer 18 and the quantum structure layer 20. That is to say, on the slide wall of the WZ crystal part 16WZ of the pillar-shaped structure 16, a barrier layer of a WZ crystal (WZ crystal part 18WZ) and a quantum structure layer of a WZ crystal (WZ crystal part 20WZ) are formed. Furthermore, on the side wall of the ZB crystal part 16ZB of the pillar-shaped structure 16, a barrier layer of a ZB crystal (ZB crystal part 18ZB) and a quantum structure layer of a ZB crystal (ZB crystal part 20ZB) are formed (FIG. 12B).

As the barrier layer 18, for example, InGaAs may be applied. As the raw materials of InGaAs, for example, trimethylindium (TMIn), trimethylgallium (TEGa), and arsine (AsH$_3$) may be used.

As the quantum structure layer 20, for example, InP may be applied. As the raw materials of InP, trimethylindium (TMIn) and phosphine (PH$_3$) may be used.

In this case, the growth temperature is 450° C. through 500° C., and as for InP, the V/III ratio (flow rate ratio of PH$_3$ and TMI) is 100 through 300, and as for InGaAs, the V/III ratio (flow rate ratio of AsH$_3$ and TMI+TEG) is 20 through 60. Accordingly, it is possible to cause the barrier layers 18 and the quantum structure layers 20 to grow so as to cover the side wall and the top part of the pillar-shaped structure 16.

By applying a lower growth temperature and a higher deposition speed than those of the first embodiment, it is possible to cause the barrier layer 18 and the quantum structure layer 20 to grow so as to cover the side wall and the top part of the pillar-shaped structure 16. This is because the raw material, which has not sufficiently reacted at the side wall of the pillar-shaped structure 16, reacts at the top part of the pillar-shaped structure 16.

Next, in the same manner as the manufacturing method of the solar cell according to the first embodiment illustrated in FIG. 5B, the semiconductor layer 24 of the second conductivity is formed so as to cover the superlattice layer 22.

Figure 13A:
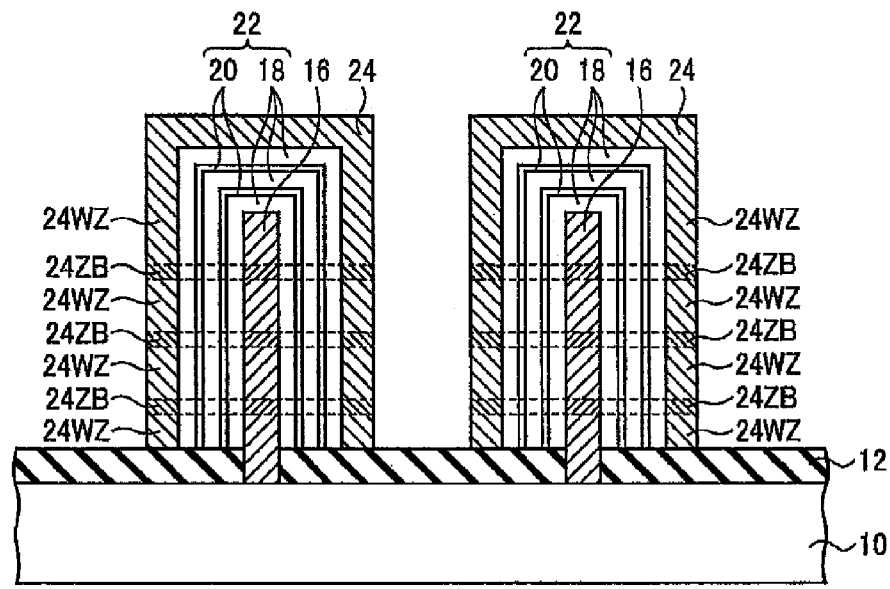
FIGS. 13A and 13B are process cross-sectional diagrams indicating a manufacturing method of a solar cell according to the third embodiment (part 2).

In this case, the crystal structure of the superlattice layer 22 is applied to the semiconductor layer 24, and a semiconductor layer of a WZ crystal (WZ crystal part 24WZ) is formed on the side wall of the WZ crystal part 18WZ of the barrier layer 18. Furthermore, on the side wall of the ZB crystal part 18ZB of the barrier layer 18, a semiconductor layer of a ZB crystal (ZB crystal part 24ZB) is formed (FIG. 13A).

Next, on the entire surface, the second conductivity electrode 30 is formed by, for example, a sputtering method, by depositing a transparent electrode material, such as a CuAlO$_2$ film.

Figure 13B:
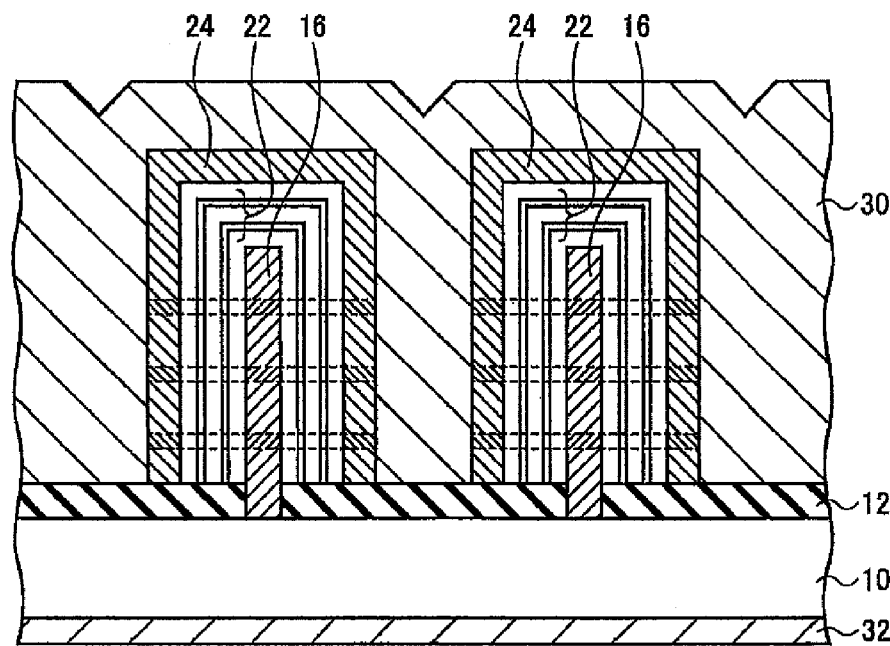

Next, the first conductivity electrode 32 is formed on the back side of the semiconductor substrate 10, thereby completing the solar cell according to the present embodiment (FIG. 13B).

As described above, according to the present embodiment, by using the difference in the energy bandgap between the wurtzite type crystal and the zinc blende type crystal, and a barrier layer, a three-dimensional quantum confining structure is formed, and therefore it is easy to closely stack and align the quantum confining structure. Accordingly, a highly-efficient solar cell may be realized. Furthermore, by forming the superlattice layer and the semiconductor layer so as to cover the pillar-shaped structure, the manufacturing process is simplified.

[Modification Embodiments]

Various modifications may be made other than the above embodiments.

For example, the above-described first through third embodiments mainly describes a solar cell using a superlattice structure of an InP/InGaAs system; however, the same is applicable to a solar cell using a superlattice structure of a GaAs/InGaAs system. In this case, on the pillar-shaped structure 16 constituted by GaAs, a ZB crystal may be grown by setting the growth temperature at approximately 530° C. through 580° C., and setting the V/III ratio at, for example, 2 through 8, and a WZ crystal may be grown by setting the V/III ratio at, for example, 20 through 80.

Furthermore, in the above-described first through third embodiments, a ring-shaped quantum box is formed by the ZB crystal part 20ZB of the quantum structure layer 20, and a confining structure is not formed in the circumferential direction of the ring; however, a confining structure may also be formed in the circumferential direction of the ring. For example, a low-distortion material, which does not affect the depositing, may be used to form the quantum structure layer 20 such that the quantum structure layer 20 is formed to have a quantum dot shape, and a confining structure is implemented in the circumferential direction of the ring.

Furthermore, the above-described third embodiment indicates a solar cell in which the superlattice layer 22 and the semiconductor layer 24 are formed so as to also cover the top part of the pillar-shaped structure 16 in the solar cell according to the first embodiment; however, the superlattice layer 22 and the semiconductor layer 24 may be formed so as to also cover the top part of the pillar-shaped structure 16 in the solar cell according to the second embodiment.

Furthermore, in the above embodiments, the cross-sectional shape of the pillar-shaped structure 16 is not particularly described; the shape may be symmetrical such as a circle and a polygon, or an asymmetrical shape such as an oval.

Furthermore, in the above embodiments, the pillar-shaped structure 16 has a fixed thickness; however, the thickness of the pillar-shaped structure 16 need not be fixed. For example, the pillar-shaped structure may have a frustum shape whose thickness gradually decreases in the direction away from the semiconductor substrate 10. Particularly, when the diameter on the side of the semiconductor substrate 10 is large, the contact area between the pillar-shaped structure 16 and the semiconductor substrate 10 becomes large, which is preferable in that the interface resistance is reduced.

Furthermore, in the above embodiments, a description is given of a solar cell in which the first conductivity is the n type and the second conductivity is the p type; however, the same applies to a solar cell in which the first conductivity is the p type and the second conductivity is the n type.

Furthermore, the structure, the materials, and the manufacturing conditions of the solar cell according to the above amendments are merely examples, and modifications and variations may be made according to the common general knowledge of those skilled in the art.

According to an aspect of the embodiments, a solar cell and a manufacturing method thereof are provided, by which it is easy to closely stack and align the quantum confining structures, and realize a highly-efficient solar cell.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A solar cell comprising:
 a semiconductor substrate of a first conductivity;
 a pillar-shaped structure made of a semiconductor of the first conductivity, the pillar-shaped structure being formed on the semiconductor substrate to include wurtzite type crystal parts and zinc blende type crystal parts that are alternately arranged along an axial direction of the pillar-shaped structure;
 a superlattice layer including a barrier layer and a quantum structure layer that are alternately deposited on a side wall of the pillar-shaped structure, the quantum structure layer made of a material having a smaller energy bandgap than that of the barrier layer, the quantum structure layer including wurtzite type crystal parts and zinc blende type crystal parts that are alternately arranged along the axial direction of the pillar-shaped structure; and a semiconductor layer of a second conductivity that is formed so as to surround the superlattice layer, the second conductivity being an opposite conductivity to that of the first conductivity, wherein the zinc blende type crystal parts of the quantum structure layer are arranged to have different sizes in the axial direction of the pillar-shaped structure such that the closer the zinc blende type crystal part is to the semiconductor substrate, the larger a size of the zinc blende type crystal part in the axial direction of the pillar-shaped structure, wherein parts of the superlattice layer, which contact the wurtzite type crystal parts of the pillar-shaped structure, are wurtzite type crystal, and parts of the superlattice layer, which contact the zinc blende type crystal parts of the pillar-shaped structure, are zinc blende type crystal.

2. The solar cell according to claim 1,
wherein the zinc blende type crystal parts of the pillar-shaped structure have sizes in the axial direction of the pillar-shaped structure that are less than or equal to 20 nm.

3. The solar cell according to claim 1, further comprising:
a first electrode that is electrically connected to the semiconductor substrate; and
a second electrode that is electrically connected to the semiconductor layer.

4. The solar cell according to claim 1,
wherein the barrier layer is an InP layer, and the quantum structure layer is an InGaAs layer.

5. The solar cell according to claim 1,
wherein the barrier layer is a GaAs layer, and the quantum structure layer is an InGaAs layer.

* * * * *